United States Patent [19]

Nilssen

[11] Patent Number: 4,677,345
[45] Date of Patent: Jun. 30, 1987

[54] INVERTER CIRCUITS

[76] Inventor: Ole K. Nilssen, 1984 Caesar Dr. - Rte. 4, Barrington, Ill. 60010

[21] Appl. No.: 262,542

[22] Filed: May 11, 1981

Related U.S. Application Data

[62] Division of Ser. No. 178,107, Aug. 14, 1980, abandoned.

[51] Int. Cl.$^4$ .................. H05B 37/02; H05B 39/04; H05B 41/36
[52] U.S. Cl. ..................... 315/209 R; 331/113 A; 363/132; 315/DIG. 4; 315/DIG. 7; 315/219
[58] Field of Search ............. 315/53, DIG.4, DIG. 5, 315/DIG. 7, 209, 219, 220, 240, 276, 278, 279; 331/113 A

[56] References Cited

U.S. PATENT DOCUMENTS

| | | | |
|---|---|---|---|
| 3,133,256 | 5/1964 | Denelsbeck et al. | 331/113 A |
| 3,691,450 | 9/1972 | Cox | 315/219 |
| 4,051,413 | 9/1977 | Abadie | 315/DIG. 7 |
| 4,060,751 | 11/1977 | Anderson | 331/113 A |
| 4,060,752 | 11/1977 | Walker | 315/DIG. 7 |
| 4,075,476 | 2/1978 | Pitel | 315/278 |
| 4,127,795 | 11/1978 | Knoll | 315/DIG. 4 |
| 4,188,661 | 2/1980 | Bower et al. | 315/220 |
| 4,199,710 | 4/1980 | Knoll | 315/220 |
| 4,207,497 | 6/1980 | Capewell et al. | 315/DIG. 4 |
| 4,259,614 | 3/1981 | Kohler | 315/219 |
| 4,288,725 | 9/1981 | Morton | 315/53 |
| 4,307,353 | 12/1981 | Nilssen | 331/113 A |
| 4,353,009 | 10/1982 | Knoll | 315/220 |
| 4,441,054 | 4/1984 | Bay | 315/DIG. 4 |
| 4,513,364 | 4/1985 | Nilssen | 363/132 |

Primary Examiner—Saxfield Chatmon

[57] ABSTRACT

High-efficiency inverter circuits, particularly half-bridge devices, are especially suitable for energizing gas discharge lamps. The inverters preferably employ a series-connected combination of an inductor and a capacitor to be energized upon periodic transistor conduction. Transistor drive current is preferably provided through the use of at least one saturable inductor to control the transistor inversion frequency to be equal to or higher than the natural resonant frequency of the inductor and capacitor combination. The inverters can develop high output voltages to supply external loads connected to the inductor-capacitor combinations.

19 Claims, 11 Drawing Figures

INVERTER CIRCUITS

This application is a division of application Ser. No. 178,107, filed Aug. 14, 1980, now abandoned.

BACKGROUND OF THE INVENTION

1. Field of the Invention

This invention relates in general to power supply circuits, and, more particularly, to high-efficiency inverter circuits operable to provide high voltage outputs.

2. Description of the Prior Art

As is well-known in the art, the main function of an inverter circuit is to convert a direct or DC input voltage into an alternating or AC voltage output. See, for example my U.S. Pat. No. 4,184,128, issued Jan. 15, 1980, and entitled "High Efficiency Push-Pull Inverters"; Murray et al. U.S. Pat. No. 3,467,852, issued Sept. 16, 1969, entitled "High Speed Controlled Switching Circuit"; Engel et al. U.S. Pat. No. 3,753,071, issued Aug. 14, 1973, for "Low Cost Transistorized Inverter"; and Suzuki et al. U.S. Pat. No. 4,031,454, issued June 21, 1977, entitled "Transistor Inverter".

In certain applications of inverter circuits, such as energizing fluorescent or other gas discharge lamps, it is important to provide high voltages both for starting ease and efficient operation. The following U.S. patents are believed to be representative of the prior art relevant to such lamps and energizing circuits therefor:

| Patentee | Patent No. | Issue Date | Title |
| --- | --- | --- | --- |
| Morley | 2,279,635 | Apr. 14, 1942 | LUMINOUS VAPOR LAMP |
| Miller | 2,298,961 | Oct. 13, 1942 | FLUORESCENT LAMP |
| Polevitzky | 2,405,518 | Aug. 6, 1946 | ILLUMINATING DEVICE |
| Rogers | 2,505,993 | May 2, 1950 | FLUORESCENT ELECTRIC LAMP |
| Dupuy | 2,525,022 | Oct. 10, 1950 | CIRCULAR LIGHTING FIXTURE |
| Baumgartner et al. | 2,817,004 | Dec. 17, 1957 | ADAPTER HOLDER FOR CIRCULAR LAMPS |
| Fry | 2,878,372 | Mar. 17, 1959 | CIRCULAR LIGHTING FIXTURE |
| Reaves | 3,059,137 | Oct. 16, 1962 | SCREW-IN FLUORESCENT LIGHTING FIXTURE |
| Grunwaldt | 3,084,283 | Apr. 2, 1963 | TRANSISTOR-BATTERY SUPPLY FOR GAS DISCHARGE TUBES |
| Wenrich et al. | 3,155,875 | Nov. 3, 1964 | HIGH FREQUENCY BALLAST FOR FLUORESCENT LAMPS |
| Genuit | 3,263,122 | July 26, 1966 | CURRENT LIMITING INVERTER CIRCUITS AND APPARATUS FOR OPERATING ELECTRIC DISCHARGE LAMPS AND OTHER LOADS |
| Johnson | 3,634,681 | Jan. 11, 1972 | INTEGRAL BALLAST, LAMP-HOLDER SUPPORT AND WIREWAY |
| Piccola | 3,704,212 | Nov. 28, 1972 | ADJUSTABLE LIGHT FIXTURE FOR U-SHAPED LAMPS |
| Anderson | 4,093,893 | June 6, 1978 | SHORT ARC FLUORESCENT LAMP |
| Wheeler | 4,093,974 | June 6, 1978 | FLUORESCENT LIGHT FIXTURE |
| Miller | 4,161,020 | July 10, 1979 | FLUORESCENT LAMPHOLDER ASSEMBLY FOR CIRCLINE LAMP |
| Young et al. | 4,173,730 | Nov. 6, 1979 | COMPACT FLUORESCENT LAMP UNIT HAVING INTEGRAL CIRCUIT MEANS FOR DC OPERATION |

While gas discharge lamp units and associated energizing circuits are generally known in the prior art typified by these patents, need has arisen for improved devices of these types, particularly inexpensive, reliable and highly efficient inverter circuits which can be employed to provide high voltage outputs suitable for energizing gas discharge lamps.

SUMMARY OF THE INVENTION

The present invention is directed to satisfy these needs. The inverter circuits according to the present invention are highly efficient, can be compactly constructed and are ideally suited for energizing gas discharge lamps, particularly "instant-start" and "self-ballasted" fluorescent lamps.

In general, according to one form of the present invention, a series-connected combination of an inductor and a capacitor is provided in circuit with the inverter transistors to be energized upon periodic transistor conduction. Transistor drive current is preferably provided through the use of at least one saturable inductor to control the transistor inversion frequency to be equal to or greater than the natural resonant frequency of the inductor and capacitor combination. The high voltages efficiently developed by loading the inverter with the inductor and capacitor are ideally suited for energizing external loads such as gas discharge lamps. In such an application, the use of an adjustable inductor permits control of the inverter output as a means of adjusting the level of lamp illumination.

According to another important form of the present invention, reliable and highly efficient half-bridge inverters include a saturable inductor in a current feedback circuit to drive the transistors for alternate conduction. The inverters also include a load having an inductance sufficient to effect periodic energy storage for self-sustained transistor inversion. As a result, these half-bridge inverter circuits obviate the need for additional voltage feedback as required in the prior art such as disclosed in the previously-mentioned Suzuki patent. Importantly, improved reliability is achieved because of the relatively low and transient-free voltages across the transistors in these half-bridge inverters.

Further, according to another feature of the present invention, novel and economical power supplies particularly useful with the disclosed inverter circuits convert conventional AC input voltages to DC for supply to the inverters.

These and other important objects of the present invention will become apparent from the following description which, when taken in conjunction with the accompanying drawings, discloses preferred embodiments of the invention.

DESCRIPTION OF THE PREFERRED EMBODIMENTS

Figure 1:
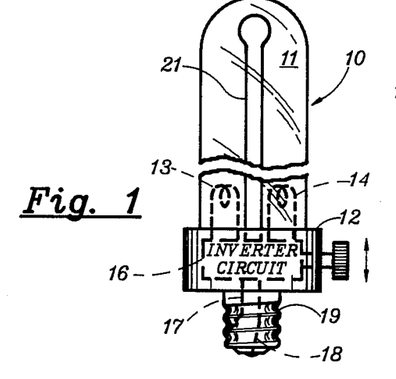
FIG. 1 is a front elevation of a folded fluorescent lamp unit adapted for screw-in insertion into a standard Edison incandescent socket.

FIG. 1 illustrates a screw-in gas discharge lamp unit 10 comprising a folded fluorescent lamp 11 suitably secured to an integral base 12. The lamp comprises two cathodes 13, 14 which are supplied with the requisite high operating voltage from an inverter circuit 16, which, because of its compact size, conveniently fits within the base 12. The inverter circuit 16, which can be in the form schematically illustrated in FIG. 2 or 7, will be described in detail later.

The inverter circuit 16 is connected by means of leads 17, 18 to a screw-type plug 19 adapted for insertion into a standard Edison-type incandescent socket at which a typical 60 Hz. 120 volt AC source is available. A ground plane comprising a wire or metallic strip 21 is disposed adjacent a portion of the fluorescent lamp 11 as a starting aid. Finally, a manually-rotatable external knob 22 is connected to a shaft for mechanical adjustment of the air gap of a ferrite core inductor to vary the inductance value thereof in order to effect adjustment of the inverter voltage output connected to electrodes 13, 14 for controlled variation of the lamp illumination intensity.

Figure 2:
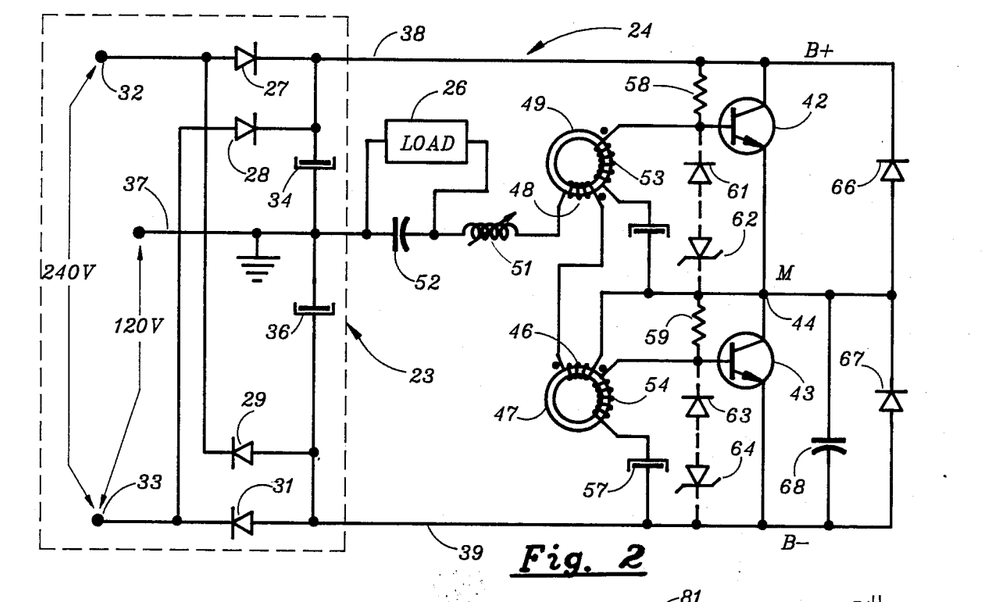
FIG. 2 is a schematic diagram illustrating the essential features of a push-pull inverter circuit particularly suitable for energizing in the lamp unit of FIG. 1.

With reference to FIG. 2, a power supply 23, connected to a conventional AC input, provides a DC output for supplying a high-efficiency inverter circuit 24. The inverter is operable to provide a high voltage to an external load 26, which may comprise a gas discharge device such as the fluorescent lamp 11 of FIG. 1.

The power supply 23 comprises a bridge rectifier having four diodes 27, 28, 29 and 31 connectable to a 240 volt AC supply at terminals 32, 33. Capacitors 34, 36 are connected between a ground line 37 (in turn directly connected to the inverter 24) and to a B+ line 38 and a B− line 39, respectively. The power supply 23 also comprises a voltage doubler and rectifier optionally connectable to a 120 volt AC input taken between the ground line 37 and terminal 33 or 32. The voltage doubler and rectifier means provides a direct electrical connection by way of line 37 between one of the 120 volt AC power input lines and the inverter 24, as shown in FIG. 2. The bridge rectifier and the voltage doubler and rectifier provide substantially the same DC output voltage to the inverter 24 whether the AC input is 120 or 240 volts. Typical voltages are +160 volts on the B+ line 38 and −160 volts on the B− line 39.

Figure 4:
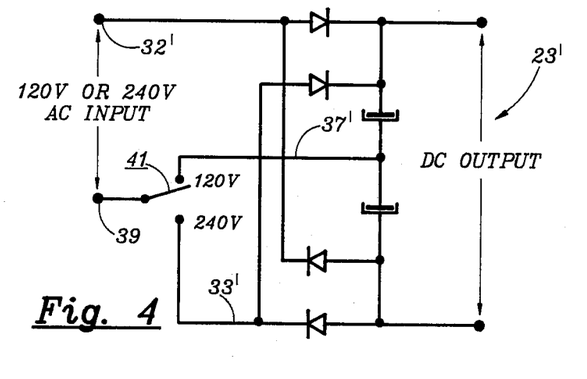
FIG. 4 is a schematic diagram of a DC power supply connectable to both 120 and 240 volt AC inputs.

With additional reference to FIG. 4, which shows an alternate power supply 23', the AC input, whether 120 or 240 volts, is provided at terminals 32' and 39. Terminal 39 is in turn connected through a single-pole double-throw selector switch 41 to terminal 37' (for 120 volt operation) or terminal 33' (for 240 volt operation). In all other respects, power supplies 23 and 23' are identical.

The inverter circuit 24 of FIG. 2 is a half-bridge inverter comprising transistors 42, 43 connected in series across the DC voltage output of the power supply 23 on B+ and B− lines 38 and 39, respectively. The collector of transistor 42 is connected to the B+ line 38, the emitter of transistor 42 and the collector of transistor 43 are connected to a midpoint line 44 (designated "M") and the emitter of transistor 43 is connected to the B− line 39. The midpoint line 44 is in turn connected to the ground line 37 through a primary winding 46 of a toroidal saturable core transformer 47, a primary winding 48 on an identical transformer 49, an inductor 51 and a series-connected capacitor 52. The inductor 51 and capacitor 52 are energized upon alternate transistor conduction in a manner to be described later.

An external load 26 is preferably taken off of capacitor 52, as shown in FIG. 2. The inductor 51, preferably a known ferrite core inductor, has an inductance variable by mechanical adjustment of the air gap in order to effect variation in the level of the inductor and capacitor voltage and hence the power available to the load, as will be described. When the load is a gas discharge lamp such as lamp 11 in FIG. 1, variation of this inductance upon rotation of knob 22 accomplishes a lamp dimming effect.

Drive current to the base terminals of transistors 42 and 43 is provided by secondary windings 53, 54 of transformers 49, 47, respectively. Winding 53 is also connected to midpoint lead 44 through a bias capacitor 56, while winding 54 is connected to the B− lead 39 through an identical bias capacitor 57. The base terminals of transistors 42 and 43 are also connected to lines 38 and 44 through bias resistors 58 and 59, respectively. For a purpose to be described later, the base of transistor 42 can be optionally connected to a diode 61 and a series Zener diode 62 in turn connected to the midpoint line 44; similarly, a diode 63 and a series Zener diode 64 in turn connected to the B− line 39 can be connected to the base of transistor 43. Shunt diodes 66 and 67 are connected across the collector-emitter terminals of transistors 42 and 43, respectively. Finally, a capacitor 68 is connected across the collector-emitter terminal of transistor 43 to restrain the rate of voltage rise across those terminals, as will be seen presently.

Figures 3A, 3B, 3C:
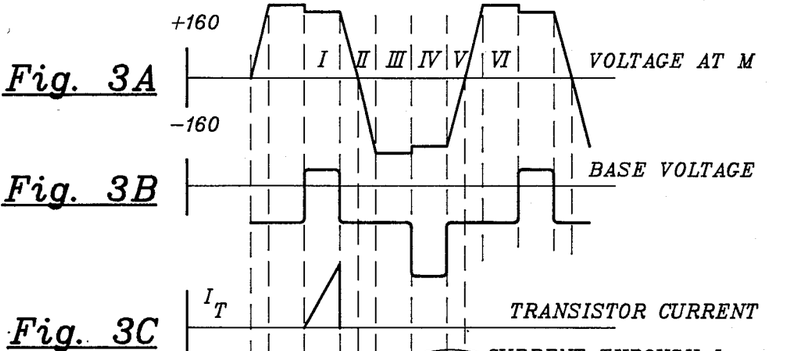
FIGS. 3A-3D is a set of waveform diagrams of certain significant voltages and currents occurring in the circuit of FIG. 2.
Figures 3D, 7:
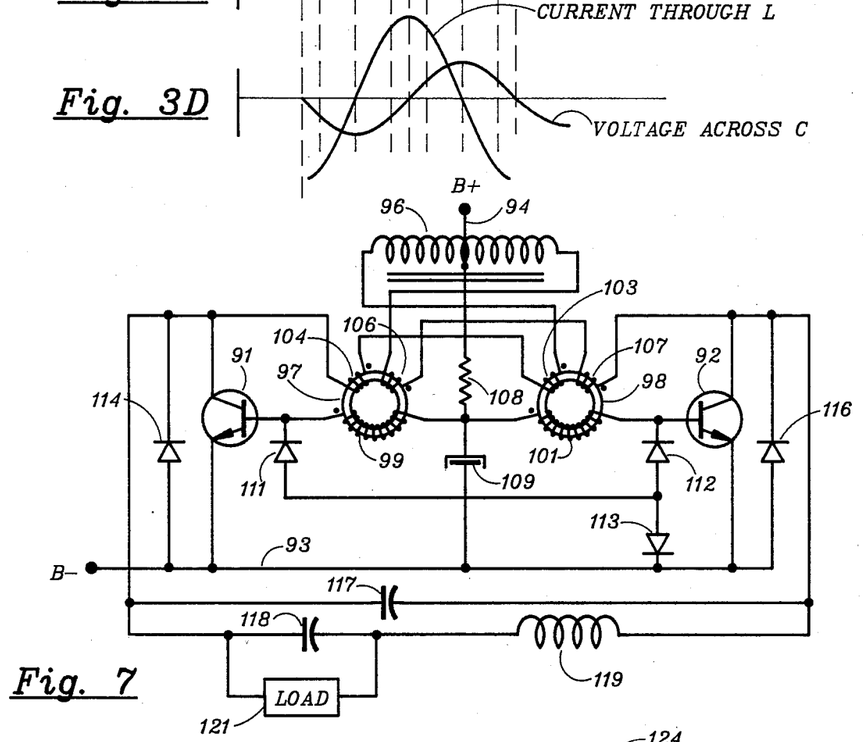
FIG. 7 is an alternate form of a push-pull inverter circuit according to the present invention.

The operation of the FIG. 2 circuit can best be understood with additional reference to FIG. 3, which illustrates significant portions of the waveforms of the voltage at the midpoint M (FIG. 3A), the base-emitter voltage on transistor 42 (FIG. 3B), the current through transistor 42 (FIG. 3C), and the capacitor 52 voltage and the inductor 51 current (FIG. 3D).

Assuming that transistor 42 is first to be triggered into conduction, current flows from the B+ line 38 through windings 46 and 48 and the inductor 51 to charge capacitor 52 and returns through capacitor 34 (refer to the time period designated I in FIG. 3). When the saturable inductor 49 saturates at the end of period I, drive current to the base of transistor 42 will terminate, causing voltage on the base of the transistor to drop to the negative voltage stored on the bias capacitor 56 in a manner to be described, causing this transistor to become nonconductive. As shown in FIG. 3C, current flow in transistor 42 terminates at the end of period I.

Because the current through inductor 51 cannot change instantaneously, current will flow from the B− line 39 through capacitor 68, causing the voltage at the midpoint line 44 to drop to −160 volts (period II in FIG. 3). The capacitor 68 restrains the rate of voltage change across the collector and emitter terminals of transistor 42. The current through the inductor 51 reaches its maximum value when the voltage at the midpoint line 44 is zero. During period III, the current will continue to flow through inductor 51 but will be supplied from the B− line 39 through the shunt diode 67. It will be appreciated that during the latter half of period II and all of period III, positive current is being drawn from a negative voltage; in reality, energy is being returned to the power supply through a path of relatively low impedance.

When the inductor current reaches zero at the start of period IV, the current through the primary winding 46 of the saturable inductor 47 will cause a current to flow out of its secondary winding 54 to cause transistor 43 to become conductive, thereby causing a reversal in the direction of current through inductor 51 and capacitor 52. When transformer 47 saturates at the end of period IV, the drive current to the base of transistor 43 terminates and the current through inductor 51 will be supplied through capacitor 68, causing the voltage at the midpoint line 44 to rise (period V). When the voltage at the midpoint line M reaches 160 volts, the current will then flow through shunt diode 66 (period VI). The cycle is then repeated.

As seen in FIG. 3, the saturable inductors 47, 49 provide transistor drive current only after the current through the inductor 51 has diminished to zero. Further, the transistor drive current is terminated before the current through the inductor 51 has reached its maximum amplitude. This coordination of base drive current and inductor current is achieved because of the series connection between the inductor 51 and the primary windings 46, 48 of saturable inductors 47, 49, respectively.

The series-connected combination of the inductor 51 and the capacitor 52 are energized upon the alternate conduction of transistors 42 and 43. With a large value of capacitance of capacitor 52, very little voltage will be developed across its terminals. As the value of this capacitance is decreased, however, the voltage across this capacitor will increase. As the value of the capacitor 52 is reduced to achieve resonance with the inductor 51, the voltage on the capacitor will rise and become infinite in a loss-free circuit operating under ideal conditions.

It has been found desirable to regulate the transistor inversion frequency, determined mainly by the saturation time of the saturable inductors 47, 49, to be equal to or higher than the natural resonant frequency of the inductor and capacitor combination in order to provide a high voltage output to the external load 26. A high voltage across capacitor 52 is efficiently developed as the transistor inversion frequency approaches the natural resonant frequency of the inductor 51 and capacitor 52 combination. Stated another way, the conduction period of each transistor is desirably shorter in duration than one quarter of the full period corresponding to the natural resonant frequency of the inductor and capacitor combination. When the inverter 24 is used with a self-ballasted gas discharge lamp unit, it has been found that the inversion frequency can be at least equal to the natural resonant frequency of the tank circuit. If the capacitance value of capacitor 52 is reduced still further beyond the resonance point, unacceptably high transistor currents will be experienced during transistor switching and transistor burn-out will occur.

It will be appreciated that the sizing of capacitor 52 is determined by the application of the inverter circuit 24. Variation in the values of the capacitor 52 and the inductor 51 will determine the voltages developed in the inductor-capacitor tank circuit. The external load 26 may be connected in circuit with the inductor 51 (by a winding on the inductor, for example) and the capacitor 52 may be omitted entirely. If the combined circuit loading of the inductor 51 and the external load 26 has an effective inductance of value sufficient to effect periodic energy storage for self-sustained transistor inversion, the current feedback provided by the saturable inductors 47, 49 will effect alternate transistor conduction without the need for additional voltage feedback. When the capacitor 52 is omitted, the power supply 23 provides a direct electrical connection between one of the AC power input lines and the inverter load circuit.

Because the voltages across the transistors 42, 43 are relatively low (due to the effect of capacitors 34,36), the half-bridge inverter 24 is very reliable. The absence of switching transients minimizes the possibility of transistor burn-out.

The inverter circuit 24 comprises means for supplying reverse bias to the conducting transistor upon saturation of its associated saturable inductor. For this purpose, the capacitors 56 and 57 are charged to negative voltages as a result of reset current flowing into secondary windings 53, 54 from the bases of transistors 42, 43, respectively. This reverse current rapidly turns off a conducting transistor to increase its switching speed and to achieve inverter circuit efficiency in a manner described more fully in my co-pending U.S. patent application Ser. No. 103,624 filed Dec. 14, 1979 and entitled "Bias Control for High Efficiency Inverter Circuit". The more negative the voltages on bias capacitors 56 and 57, the more rapidly charges are swept out of the bases of their associated transistors upon transistor turn-off.

When a transistor base-emitter junction is reversely biased, it exhibits the characteristics of a Zener diode having a reverse breakdown voltage on the order of 8 to 14 volts for transistors typically used in high-voltage inverters. As an alternative, to provide a negative voltage smaller in magnitude on the base lead of typical transistor 42 during the reset operation, the optional diode 61 and Zener diode 62 combination can be used. For large values of the bias capacitor 56, the base voltage will be substantially constant.

If the load 26 comprises a gas discharge lamp, the voltage across the capacitor 52 will be reduced once the lamp is ignited to prevent voltages on the inductor 51 and the capacitor 52 from reaching destructive levels. Such a lamp provides an initial time delay during which a high voltage, suitable for instant starting, is available.

Figures 5, 6:
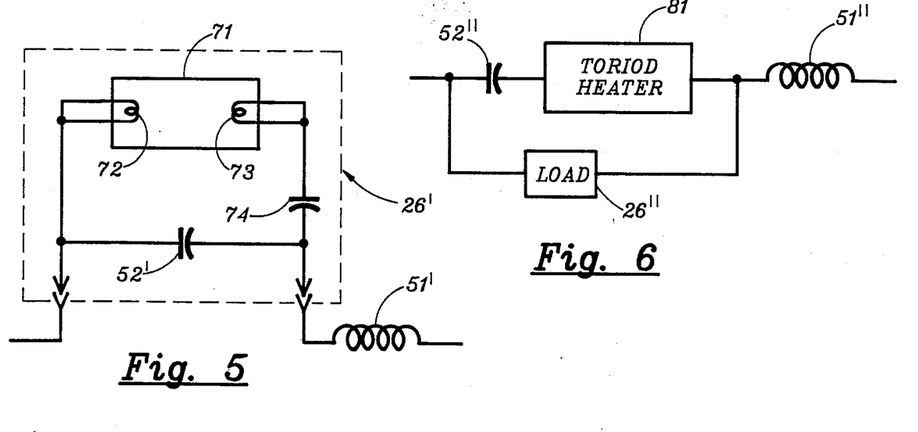
FIG. 5 is a schematic diagram which illustrates the connection of a non-self-ballasted gas dicharge lamp unit to the FIG. 2 inverter circuit.
FIG. 6 is a schematic diagram which illustrates the use of a toroid heater for regulation of the inverter output.

FIG. 5 illustrates the use of an alternate load 26' adapted for plug-in connection to an inverter circuit such as shown in FIG. 2. The load 26' consists of a gas discharge lamp 71 having electrodes 72, 73 and connected in series with a capacitor 74. The combination of lamp 71 and capacitor 74 is connected in parallel with a capacitor 52' which serves the same purpose as capacitor 52 in the FIG. 2 circuit. However, when the load 26' is unplugged from the circuit, the inverter stops oscillating and the development of high voltages in the inverter is prevented. The fact that no high voltages are generated by the circuit if the lamp is disconnected while the circuit is oscillating is important for safety reasons.

FIG. 6 illustrates a capacitor 52" connected in series with an inductor 51" through a heater 81 suitable for heating the toroidal inductors 47, 49 in accordance with the level of the output. The load 26" is connected across the series combination of the capacitor 52" and the toroid heater. The heater 81 is preferably designed to controllably heat the toroidal saturable inductors in order to decrease their saturation flux limit and hence their saturation time. The result is to decrease the periodic transistor conduction time and thereby increase the transistor inversion frequency. When a frequency-dependent impedance means, that is, an inductor or a capacitor, is connected in circuit with the AC voltage output of the inverter, change in the transistor inversion frequency will modify the impedance of the frequency-dependent impedance means and correspondingly modify the inverter output. Thus, as the level of the output increases, the toroid heater 81 is correspondingly energized to effect feedback regulation of the output. Further, transistors 42, 43 of the type used in high voltage inverters dissipate heat during periodic transistor conduction. As an alternative, the toroid heater 81 can use this heat for feedback regulation of the output or control of the temperature of transistors 42, 43.

The frequency dependent impedance means may also be used in a circuit to energize a gas discharge lamp at adjustable illumination levels. Adjustment in the inversion frequency of transistors 42, 43 results in control of the magnitude of the AC current supplied to the lamp. This is preferably accomplished where saturable inductors 47, 49 have adjustable flux densities for control of their saturation time.

FIG. 7 schematically illustrates an alternate form of inverter circuit, shown without the AC to DC power supply connections for simplification. In this Figure, the transistors are connected in parallel rather than in series but the operation is essentially the same as previously described.

In particular, this circuit comprises a pair of alternately conducting transistors 91, 92. The emitter terminals of the transistors are connected to a B− line 93. A B+ lead 94 is connected to the center-tap of a transformer 96. In order to provide drive current to the transistors 91, 92 for control of their conduction frequency, saturable toroidal inductors 97, 98 have secondary windings 99, 101, respectively, each secondary winding having one end connected to the base of its associated transistor; the other ends are connected to a common terminal 102. One end of transformer 96 is connected to the collector of transistor 91 through a winding 103 on inductor 98 in turn connected in series with a winding 104 on inductor 97. Likewise, the other end of transformer 96 is connected to the collector of transistor 92 through a winding 106 on inductor 97 in series with another winding 107 on inductor 98.

The B+ terminal 94 is connected to terminal 102 through a bias resistor 108. A bias capacitor 109 connects terminal 102 to the B− lead 93. This resistor and capacitor serve the same function as resistors 58, 59 and capacitors 56, 57 in the FIG. 2 circuit.

The bases of transistors 91, 92 are connected by diodes 111, 112, respectively, to a common Zener diode 113 in turn connected to the B− lead 93. The common Zener diode 113 serves the same function as individual Zener diodes 62, 64 in FIG. 2.

Shunt diodes 114, 116 are connected across the collector-emitter terminals of transistors 91, 92, respectively. A capacitor 117 connecting the collectors of transistors 91, 92 restrains the rate of voltage rise on the collectors in a manner similar to the collector-emitter capacitor 68 in FIG. 2.

Inductive-capacitive loading of the FIG. 7 inverter is accomplished by a capacitor 118 connected in series with an inductor 119, the combination being connected across the collectors of the transistors 91, 92. A load 121 is connected across the capacitor 118.

Figure 8:
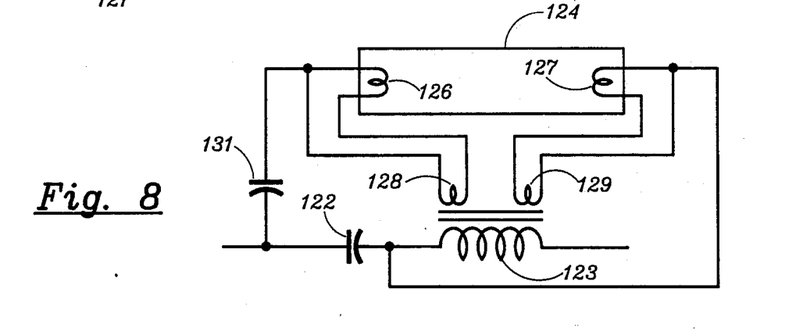
FIG. 8 is a schematic diagram showing the connection of a gas discharge lamp of the "rapid-start" type to an inductor-capacitor-loaded inverter according to the present invention.

FIG. 8 illustrates how an inverter loaded with a series capacitor 122 and inductor 123 can be used to energize a "rapid-start" fluorescent lamp 124 (the details of the inverter circuit being omitted for simplification). The lamp 124 has a pair of cathodes 126, 127 connected across the capacitor 122 for supply of operating voltage in a manner identical to that previously described. In addition, the inductor 123 comprises a pair of magnetically-coupled auxiliary windings 128, 129 for electrically heating the cathodes 126, 127, respectively. A small capacitor 131 is connected in series with lamp 124.

It is thought that the present invention and many of its attendant advantages will be understood from the foregoing description and that many changes may be made in the form and construction of its component parts, the forms described being merely preferred embodiments of the invention.

The embodiments of the invention in which an exclusive property or privilege is claimed are defined as follows:

1. A power supply operable to energize a gas discharge lamp at adjustable illumination levels, comprising:
   an inverter circuit having at least one periodically conducting transistor in circuit with a DC voltage input and being operable to provide an AC voltage output;
   frequency dependent impedance means connected in circuit between the AC voltage output and the lamp; and an AC current output operable to connect with
   control means connected with the inverter circuit and operative to control the transistor inversion frequency and correspondly: (i) the impedance of the frequency dependent impedance means, and (ii) the magnitude of the AC current supplied to the lamp; the control means being separate from and independent of the frequency dependent impedance means.

2. The power supply of claim 1 wherein the controlling means comprises a saturable inductor means.

3. The power supply of claim 2 wherein the saturable inductor means has an adjustable saturation flux density for control of its saturation time.

4. A lamp unit operable to be powered from a source of AC voltage, said source having a pair of output terminals and an internal substantially inductive source impedance, said AC voltage being of frequency substantially higher than that of the voltage on an ordinary electric utility power line, said lamp unit comprising:
- a gas discharge lamp with a pair of electrodes;
- capacitor means connected in circuit between said electrodes, said capacitor means being substantially resonant with said inductive source impedance at the fundamental frequency of said AC voltage;
- connect means operative to permit disconnectable connection of said electrodes with said output terminals; whereby, when the lamp unit is indeed so connected, there is resonant interaction between said capacitor means and said inductive source impedance; and
- structure means operative to support and integrate into a single mechanical entity said gas discharge lamp, said capacitor means, and said connect means; whereby, when said lamp unit is physically removed from said output terminals, said capacitor means is also physically removed therefrom.

5. A system for powering a gas discharge lamp, said lamp having a pair of electrodes with a shunting means connected thereacross, said system comprising:
- a source of DC voltage;
- an inverter circuit connected with said DC voltage and having a pair of output terminals, said inverter circuit: (i) being rendered operative as an inverter whenever output current is permitted to flow between said output terminals, thereby providing an AC voltage of relatively high frequency across said output terminals, and (ii) being rendered inoperative as an inverter whenever output current is prevented from flowing between said output terminals, thereby preventing said AC voltage from appearing across said output terminals; and
- connect means operative to disconnectably connect said lamp in circuit across said output terminals, whereby: (i) whenever said lamp with its shunting means is connected thereacross, said shunting means is operative to permit output current to flow, thereby rendering said inverter circuit operative to provide said AC voltage across said output terminals and thereby operable to start and power said lamp, and (ii) whenever said lamp with its shunting means is not connected thereacross, said inverter circuit is rendered inoperative as an inverter thereby ensuring that no AC voltage is provided across said output terminals.

6. The system of claim 5 wherein the magnitude of the impedance of said shunting means is comparable to that of the impedance of the lamp when lighted.

7. A ballasting means for a gas discharge lamp, comprising:
- a source of DC voltage;
- an inverter means connected with said DC voltage and operative to provide an AC voltage at a set of output terminals, said AC voltage being of frequency substantially higher than that of the voltage on an ordinary electric utility power line, said inverter means comprising at least one periodically conducting transistor connected in circuit with a saturable inductor means, said saturable inductor means being operative to determine the conduction period of said periodically conducting transistor;
- tank circuit means having an inductor and a capacitor connected in circuit with said output terminals, said tank circuit having a natural resonance frequency; and
- connect means operative to permit connection of said lamp with said tank circuit, thereby effectively to provide starting voltage and operating power for said lamp;
- whereby said tank circuit and said saturable inductor means co-operate to determine the frequency of said AC voltage, the length of said conduction period being determinative of the amount of operating power provided to said lamp.

8. The ballasting means of claim 7 wherein said conduction period is approximately equal to or shorter than half of the period of said natural resonance frequency.

9. The ballasting means of claim 7 and means for adjustably varying said conduction period, thereby permitting adjustment of the amount of power provided to said lamp.

10. An assembly comprising:
- a gas discharge lamp having a pair of lamp electrodes; and
- a mechanical structure secured to said lamp and containing: (i) a screw-base adapted for insertion into an Edison-type lamp socket, said screw-base having a pair of base electrodes, (ii) an inverter type power supply connected in circuit between said base electrodes and said lamp electrodes and operable to provide AC starting voltage and operating power for said lamp, the starting voltage and operating power being provided at a frequency substantially higher than that of the voltage on an ordinary electric utility power line, and (iii) adjust means connected in circuit with said power supply and operable to permit manual adjustment of the magnitude of the operating current;
- thereby to combine said gas discharge lamp, said screw base, said inverter type power supply, and said adjust means into a single substantially rigid mechanical lamp unit having manually operable means for adjusting the light output provided therefrom.

11. An assembly comprising:
- a gas discharge lamp having a pair of lamp electrodes; and
- a mechanical structure secured to said lamp and containing: (i) screw-base adapted for insertion into an ordinary Edison-type lamp socket, said screw-base having a pair of base electrodes, (ii) frequency converter means, said converter means connected in circuit with said base electrodes and comprising at least one periodically conducting transistor and being operable to provide an AC voltage at a set of output terminals, the frequency of the AC voltage being substantially higher than that of the voltage on an ordinary electric utility power line, (iii) an L-C circuit connected with said output terminals, the L-C circuit being resonant at or near the fundamental frequency of the AC voltage, (iv) connect means operative to connect said lamp electrodes in circuit with said L-C circuit, and (v) adjust means operative to permit manual adjustment of the magnitude of current provided to said lamp.

12. A lamp assembly for use with a source of AC voltage having a substantially reactive internal impedance, said AC voltage being of frequency substantially higher than that of the voltage on an ordinary electric utility power line, said lamp assembly comprising:
- a gas discharge lamp having two electrodes;
- reactive shunt impedance means connected in circuit between said electrodes and having a reactance that, at the fundamental frequency of said AC voltage, is substantially the conjugate of that of said internal impedance;

connect means operative to permit disconnectable connection of said electrodes with said scource of AC voltage; and structure means operative to support and integrate into a single mechanical structure said lamp, said reactive shunt impedance means, and said connect means;

whereby: (i) whenever said lamp assembly is connected with said source, resonant or near-resonant action takes place, while (ii) whenever said lamp assembly is disconnected from said source, such resonant or near-resonant action is prevented from taking place.

13. The system of claim 12 wherein said AC voltage is provided by way of an inverter, and wherein said inverter ceases to provide said AC voltage whenever said lamp assembly is disconnected from said source.

14. A system for powering a gas discharge lamp, comprising:

a source of DC voltage;

an inverter connected with said DC voltage and providing an AC voltage at a set of output terminals, said inverter having temperature responsive control means by which the frequency of said AC voltage is operative to be changed as a function of the degree of heating supplied to said control means, the frequency of the AC voltage being substantially higher than that of the voltage on an ordinary electric utility power line; and frequency responsive impedance means connected in circuit between said output terminals and said lamp, and operative to limit the magnitude of the current supplied to said lamp, the magnitude of the current supplied being a function of the frequency of said AC voltage;

whereby said lamp is operative to provide light output to a degree that is a function of the degree of heating provided to said control means.

15. A lighting system comprising:

a source of AC voltage, said source having a substantially reactive internal source impedance and a set of source output terminals, said AC voltage being of frequency substantially higher than that of the voltage present on an ordinary electric utility power line; and a gas discharge lamp, said lamp having: (i) a pair of lamp electrodes with a substantially reactive lamp impedance connected therebetween, and (ii) connect means operable to permit disconnectable connection between said electrodes and said output terminals; said lamp impedance being: (a) of substantially conjugate impedance value as compared with said source impedance at the fundamental frequency of said AC voltage, and (b) physically and non-disconnectably attached to said lamp electrodes;

whereby resonant or near-resonant action takes place whenever said lamp is connected with said source, thereby providing for effective lamp starting voltage and operating current; yet, whenever said lamp is disconnected from said source, no such resonant or near-resonant action takes place.

16. The system of claim 15 wherein said source impedance comprises an inductor means and wherein said lamp impedance comprises a capacitor means.

17. A system for powering a gas discharge lamp, comprising:

a source of DC voltage;

an inverter connected with said DC voltage and providing an AC voltage at a set of output terminals, the AC voltage being of frequency substantially higher than that of the voltage on an ordinary electric utility power line, said inverter having at least one periodically conducting transistor connected in circuit with a temperature-responsive control means operative to control the length of the conduction time of said transistor;

heating means in thermal connection with said control means and operative to control the temperature thereof; and reactive impedance circuit connected between said output terminals and said lamp and co-operative to determine the amount of current provided to said lamp, said magnitude of the current supplied also being dependent on the length of said transistor conduction time;

whereby the light output of said lamp can be controlled by way of said heating means.

18. A lamp assembly adapted to be screwed into and powered from an ordinary Edison-type lamp socket, comprising:

a gas discharge lamp having a pair of electrodes;

a source of AC voltage, the frequency of this AC voltage being substantially higher than that of the voltage present on an ordinary electric utility power line;

impedance means connected in circuit between said source of AC voltage and said gas discharge lamp and operative to determine the magnitude of the power provided thereto;

adjust means operative to permit manual control of the impedance exhibited by said impedance means, thereby permitting manual control of the amount of power provided to said gas discharge lamp; and structural means operative to support and hold together said gas discharge lamp, said source of AC voltage, said impedance means, and said adjust means;

whereby the degree of light output provided by said gas discharge lamp can be manually adjusted by way of said adjust means.

19. The system of claim 18 wherein said impedance means comprises a reactor means, and wherein said adjust means comprises means for mechanically adjusting the magnitude of the reactance of said reactor means.

* * * * *

REEXAMINATION CERTIFICATE (1778th)
United States Patent [19]
Nilssen

[11] B1 4,677,345

[45] Certificate Issued Aug. 25, 1992

[54] INVERTER CIRCUITS

[76] Inventor: Ole K. Nilssen, 1984 Caesar Dr., Rte. 4, Barrington, Ill. 60010

Reexamination Request:
No. 90/001,899, Dec. 4, 1989

Reexamination Certificate for:
Patent No.: 4,677,345
Issued: Jun. 30, 1987
Appl. No.: 262,542
Filed: May 11, 1981

Related U.S. Application Data

[62] Division of Ser. No. 178,107, Aug. 14, 1980, abandoned.

[51] Int. Cl.⁵ .............. H05B 37/02; H05B 39/04; H05B 41/36
[52] U.S. Cl. .............. 315/209 R; 315/DIG. 4; 315/DIG. 7; 315/219; 363/132; 331/113 A
[58] Field of Search .............. 315/DIG. 7, DIG. 5, 315/209 R, 244, 208, 205, DIG. 4, 241, 238, 239, 306, DIG. 2, 255, 219; 363/132; 331/113 A; 362/216

[56] References Cited

U.S. PATENT DOCUMENTS

| | | | |
|---|---|---|---|
| 3,084,283 | 4/1963 | Grunwaldt | 315/DIG. 7 |
| 3,146,406 | 8/1964 | Wilting | 315/DIG. 7 |
| 3,609,452 | 9/1971 | Skirvin | 315/238 |
| 3,611,021 | 10/1971 | Wallace | 315/239 |
| 3,691,450 | 9/1972 | Cox | 315/DIG. 7 |
| 3,882,356 | 5/1975 | Stehlin | 315/209 R |
| 4,060,751 | 11/1977 | Anderson | 315/DIG. 2 |
| 4,100,476 | 7/1978 | Ghiringhelli | 315/297 |
| 4,173,730 | 11/1979 | Young et al. | 315/DIG. 5 |
| 4,244,013 | 1/1981 | Wotowiec | 362/216 |
| 4,346,332 | 8/1982 | Walden | 315/DIG. 4 |

OTHER PUBLICATIONS

Dale et al. "Conversion of incandescent lamp sockets to fluorescent in the home market", Lighting & Design Application, Mar. 1976, pp. 18–23.

*Primary Examiner*—Eugene R. LaRoche

[57] ABSTRACT

High-efficiency inverter circuits, particularly half-bridge devices, are especially suitable for energizing gas discharge lamps. The inverters preferably employ a series-connected combination of an inductor and a capacitor to be energized upon periodic transistor conduction. Transistor drive current is preferably provided through the use of at least one saturable inductor to control the transistor inversion frequency to be equal to or higher than the natural resonant frequency of the inductor and capacitor combination. The inverters can develop high output voltages to supply external loads connected to the inductor-capacitor combinations.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 3, 4, 12-19 is confirmed.

Claims 1, 2, 5-11 are cancelled.

New claims 20-24 are added and determined to be patentable.

20. *A system for powering a gas discharge lamp; the lamp having a pair of electrodes with a shunting means connected thereacross; the system comprising:*

*a source of DC voltage;*

*an inverter circuit connected with the DC voltage; the inverter circuit: (i) having a pair of output terminals; (ii) being rendered operative as an inverter whenever output current is permitted to flow between the output terminals, thereby providing an AC voltage of relatively high frequency across the output terminals, and (iii) being rendered inoperative as an inverter whenever output current is prevented from flowing between the output terminals, thereby preventing the AC voltage from appearing thereacross; and*

*connect means operative to permit a person to disconnectably connect the lamp in circuit across the output terminals; whereby whenever the lamp is indeed connected thereacross, the inverter circuit provides the AC voltage across the output terminals, thereby to cause the lamp to start and to be powered; whereas whenever the lamp is not connected thereacross, the inverter circuit is rendered inoperative, thereby providing no AC voltage across the output terminals; such that the very action of disconnecting the lamp also causes disconnection of the shunting means, thereby rendering the inverter circuit inoperative.*

21. *A system for powering a gas discharge lamp; the lamp having a pair of electrodes with a shunting means connected thereacross; the system comprising:*

*a source of DC voltage;*

*an inverter circuit connected with the DC voltage; the inverter circuit: (i) having a pair of output terminals; (ii) being rendered operative as an inverter whenever output current is permitted to flow between the output terminals, thereby providing an AC voltage of relatively high frequency across the output terminals, and (iii) being rendered inoperative as an inverter whenever output current is prevented from flowing between the output terminals, thereby preventing the AC voltage from appearing thereacross; and*

*connect means operative to permit a person to disconnectably connect the lamp across the output terminals; whereby the action of connecting the lamp also connects the shunting means; such that: (i) whenever the lamp is indeed connected thereacross, the inverter circuit provides the AC voltage across the output terminals, thereby to cause the lamp to start and to be powered; whereas (ii) whenever the lamp is not connected thereacross, the inverter circuit is rendered inoperative, thereby providing no AC voltage across the output terminals.*

22. *A system for powering a gas discharge lamp; the lamp having a pair of electrodes with a shunting means connected thereacross, thereby to form a special lamp assembly; the system comprising:*

*a source of DC voltage;*

*an inverter circuit connected with the DC voltage; the inverter circuit: (i) having a pair of output terminals; (ii) being rendered operative as an inverter whenever output current is permitted to flow between the output terminals, thereby providing an AC voltage of relatively high frequency across the output terminals, and (iii) being rendered inoperative as an inverter whenever output current is prevented from flowing between the output terminals, thereby preventing the AC voltage from appearing thereacross; and*

*connect means operative to permit a person to disconnectably connect the special lamp assembly across the output terminals; whereby whenever the special lamp assembly is indeed connected thereacross, the inverter circuit provides the AC voltage across the output terminals, thereby to cause the lamp to start and to be powered; whereas whenever the special lamp assembly is not so connected, the inverter circuit is rendered inoperative, thereby providing no AC voltage across the output terminals.*

23. *A ballasting means for a gas discharge lamp, comprising:*

*a source providing a DC voltage at a DC output;*

*an inverter means connected with the DC output and operative to provide an AC voltage at an AC output; the AC voltage being of frequency substantially higher than that of the voltage on an ordinary electric utility power line; the inverter means comprising two periodically conducting transistors series-connected across the DC output; the transistors being connected in circuit with a saturable inductor means; the saturable inductor means being operative to determine the conduction period of each of the periodically conducting transistors;*

*tank circuit having an inductor and a capacitor connected with the AC output; the tank circuit having a natural resonance frequency at or near the fundamental frequency of the AC voltage; and*

*connect means operative to permit connection of the lamp with the tank circuit, thereby effectively provide starting voltage and operating power for the lamp; whereby the tank circuit and the saturable inductor means co-operate to determine the frequency of the AC voltage; the length of the conduction period being determinative of the amount of operating power provided to the lamp.*

24. *A power supply operable to energize a gas discharge lamp at adjustable illumination levels, comprising:*

*an inverter circuit having at least two periodically conducting transistors series-connected across a DC voltage input and being operable to provide an AC voltage at an AC voltage output;*

*frequency-dependent impedance means connected in circuit between the AC voltage output and an AC current output operable to connect with the lamp; the frequency-dependent impedance means including a tank circuit having an inductor and a capacitor; the* tank circuit having a natural resonance frequency at or near the fundamental frequency of the AC voltage; the tank circuit being capable of resonant action whether or not the lamp be connected with the AC current output; and control means connected with the inverter circuit and operative to control the transistor inversion frequency and correspondingly: (i) the impedance of the frequency-dependent impedance means, and (ii) the magnitude of the AC current supplied to the lamp; the control means being separate from and independent of the frequency-dependent impedance means.

* * * * *